United States Patent
Zheng et al.

(10) Patent No.: US 9,462,723 B2
(45) Date of Patent: Oct. 4, 2016

(54) DETACHABLE ROTATING MECHANISM WITH POSITIONING FUNCTION AND ELECTRONIC DEVICE HAVING A ROTATABLE DOOR WITH THE POSITIONING FUNCTION

(71) Applicant: Wistron Corporation, New Taipei (TW)

(72) Inventors: Yong-Liang Zheng, New Taipei (TW); Teng-Fei Huang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/842,814

(22) Filed: Sep. 1, 2015

(65) Prior Publication Data
US 2016/0150665 A1    May 26, 2016

(30) Foreign Application Priority Data
Nov. 26, 2014    (CN) ........................ 2014 1 0692837

(51) Int. Cl.
*H05K 5/00*    (2006.01)
*H05K 7/16*    (2006.01)
(Continued)

(52) U.S. Cl.
CPC .............. *H05K 7/1488* (2013.01); *E05D 7/12* (2013.01); *E05D 7/123* (2013.01); *E06B 3/5009* (2013.01); *E06B 3/5018* (2013.01); *G06F 1/181* (2013.01); *H05K 5/0226* (2013.01); *E05D 11/10* (2013.01); *E05D 2007/128* (2013.01)

(58) Field of Classification Search
CPC .... H05K 7/1488; H05K 5/0239; H05K 5/03; H05K 5/0226; E05D 7/12; E05D 7/123; E05D 11/10; E05D 2007/128; G06F 1/181; E06B 3/50; E06B 3/5009; E06B 3/5018

USPC .................. 361/724-727; 312/223.1, 223.2; 16/254, 259, 268, 271
See application file for complete search history.

(56) References Cited

U.S. PATENT DOCUMENTS 5,926,916 A * 7/1999 Lee ........................ E05D 15/502
                                                        16/230
6,130,822 A * 10/2000 Della Fiora ............. G06F 1/181
                                                        16/254
(Continued)

FOREIGN PATENT DOCUMENTS

TW    M299445    10/2006
TW    M299445 U * 10/2006

OTHER PUBLICATIONS

Office action mailed on Nov. 12, 2015 for the Taiwan application No. 103145245, filing date: Dec. 24, 2014, p. 2 line 10-26, p. 3-4 and p. 5 line 1-14.

*Primary Examiner* — Nidhi Thaker
(74) *Attorney, Agent, or Firm* — Winston Hsu; Scott Margo

(57) ABSTRACT

A detachable rotating mechanism and a related electronic device with positioning function are provided. The detachable rotating mechanism includes a base, a pivoting component and a blocking component. The base has a first surface and a second surface. The base includes a guiding structure, at least one hole structure and a positioning portion. The guiding structure and the positioning portion are disposed on the first surface. The hole structure pierces through the first surface and the second surface. The pivoting component includes a sliding portion and a pivoting portion. The sliding portion is rotatably disposed on the positioning portion and slidably assembled with the guiding structure. The pivoting portion is connected to the sliding portion and pivots to a chassis. The blocking component is disposed on the second surface. A blocking portion of the blocking component pierces through the hole structure to movably protrude from the first surface.

21 Claims, 9 Drawing Sheets

(51) Int. Cl.
*E05D 7/10* (2006.01)
*E05D 7/12* (2006.01)
*H05K 7/14* (2006.01)
*G06F 1/18* (2006.01)
*H05K 5/02* (2006.01)
*E06B 3/50* (2006.01)
*E05D 11/10* (2006.01)

(56) References Cited

U.S. PATENT DOCUMENTS

| | | | |
|---|---|---|---|
| 7,476,804 B2* | 1/2009 | Adducci | H02B 1/202 174/50 |
| 8,355,252 B2* | 1/2013 | Chan | G06F 1/181 361/694 |
| 2002/0097561 A1* | 7/2002 | Carr | G06F 1/181 361/725 |
| 2003/0026072 A1* | 2/2003 | Hrehor, Jr. | E05D 3/06 361/679.6 |
| 2007/0089269 A1* | 4/2007 | Shen | E05D 5/06 16/268 |
| 2013/0257248 A1* | 10/2013 | Bedkowski | H02B 1/38 312/329 |
| 2015/0109724 A1* | 4/2015 | Mao | G06F 1/181 361/679.6 |
| 2015/0271937 A1* | 9/2015 | Zheng | H05K 7/1494 312/293.2 |

* cited by examiner

DETACHABLE ROTATING MECHANISM WITH POSITIONING FUNCTION AND ELECTRONIC DEVICE HAVING A ROTATABLE DOOR WITH THE POSITIONING FUNCTION

BACKGROUND OF THE DISCLOSURE

1. Field of the Disclosure

The present disclosure relates to an electronic device with a door capable of rotating relative to a chassis, and more particularly, to a detachable rotating mechanism disposed between the door and the chassis for relative rotation and positioning function and an electronic device having the rotatable door with positioning function by the foresaid detachable rotating mechanism.

2. Description of the Prior Art

A conventional server apparatus includes the base, the control panel and the door. A plurality of electronic components, such as the processor, the hard disk and so on, can be disposed inside the base. The control panel is disposed on an outer surface of the base and electrically connected with the plurality of electronic components, and the user inputs a control command by the control panel. The door is detachably assembled with the base to shelter the control panel for protection. The door covers the control panel while the server apparatus is not in use, to prevent the control panel from accidental touch or dirty. The door is unfolded to expose the control panel while the server apparatus is executed. However, the conventional door is engaged with the base by locks, and the control panel is exposed for operation by detaching the door entirely from the base. The detached door putting on another place is easily lost and results in inconvenience.

SUMMARY OF THE DISCLOSURE

The present disclosure provides a detachable rotating mechanism capable of rotating and positioning relative angle between the door and the chassis and an electronic device having the rotatable door with positioning function for solving above drawbacks.

According to the claimed disclosure, a detachable rotating mechanism with positioning function includes a base, a pivoting component and a blocking component. The base has a first surface and a second surface opposite to each other. The base includes a guiding structure, at least one hole structure and a positioning portion. The guiding structure is disposed on the first surface, and a guiding space is formed between the guiding structure and the first surface. The hole structure pierces through the first surface and the second surface. The positioning portion is disposed on the first surface and adjacent to the hole structure. The pivoting component is slidably disposed inside the guiding structure. The pivoting component includes a sliding portion and a pivoting portion. The sliding portion is movably disposed on the positioning portion. The pivoting portion is connected to the sliding portion, and the pivoting portion stretches out of the base to pivot a chassis. The blocking component is disposed on the second surface. The blocking component includes at least one blocking portion piercing through the hole structure to movably protrude from the first surface, so as to stop a relative movement between the sliding portion and the positioning portion.

According to the claimed disclosure, the guiding structure includes a first baffle and a second baffle, and a length of the first baffle is substantially smaller than a length of the second baffle.

According to the claimed disclosure, the hole structure is formed between the first baffle and the second baffle.

According to the claimed disclosure, the guiding structure further includes a rib disposed between the first surface and the first baffle, or between the first surface and the second baffle.

According to the claimed disclosure, the base further includes a boss and a protrusion. The detachable rotating mechanism further includes a latching component pivoted to a position of the base adjacent to the first baffle. The latching component includes a bearing portion, a buckling portion and a contacting portion. The bearing portion is rotatably disposed on the boss. The buckling portion is connected to the bearing portion and adapted to buckle the protrusion. The contacting portion is connected to a position of the bearing portion different from the buckling portion. The contacting portion is adapted to arrange by the first baffle and to contact against the sliding portion while the buckling portion is buckled with the protrusion.

According to the claimed disclosure, the sliding portion is a slot structure, the positioning portion is disposed on a hollow region of the slot structure, and a wall of the slot structure slidably contacts against the guiding structure.

According to the claimed disclosure, two ends of the slot structure respectively contact against the positioning portion to stop the pivoting portion at a first position or a second position. An end of the slot structure is engaged with the blocking component to stop the pivoting component at a third position, and the third position is located between the first position and the second position.

According to the claimed disclosure, the blocking portion includes an inclined guiding surface and a blocking surface. The sliding portion presses the inclined guiding surface to push the blocking portion into the hole structure, and the blocking portion further utilizes the blocking surface to constrain the relative movement between the sliding portion and the positioning portion.

According to the claimed disclosure, the blocking component is a flexible slab structure having a first end and a second end opposite to each other. The first end is fixed to the second surface, and the second end is a free end protruding from the base.

According to the claimed disclosure, an electronic device having a rotatable door with position function includes a chassis, a door and at least one detachable rotating mechanism. An axial hole is formed on the chassis. The door is rotatably disposed on the chassis. The detachable rotating mechanism is disposed between the chassis and the door. The detachable rotating mechanism includes a base, a pivoting component and a blocking component. The base has a first surface and a second surface opposite to each other. The base includes a guiding structure, at least one hole structure and a positioning portion. The guiding structure is disposed on the first surface, and a guiding space is formed between the guiding structure and the first surface. The hole structure pierces through the first surface and the second surface. The positioning portion is disposed on the first surface and adjacent to the hole structure. The pivoting component is slidably disposed inside the guiding structure. The pivoting component includes a sliding portion and a pivoting portion. The sliding portion is movably disposed on the positioning portion. The pivoting portion is connected to the sliding portion, and the pivoting portion stretches out of the base to pivot a chassis. The blocking component is disposed on the second surface. The blocking component includes at least one blocking portion piercing through the hole structure to movably protrude from the first surface, so as to stop a relative movement between the sliding portion and the positioning portion.

According to the claimed disclosure, the door includes an engaging portion adapted to engage with the second end of the blocking component, so as to stay the blocking portion inside the hole structure.

According to the claimed disclosure, the chassis further includes an actuating portion, and the actuating portion presses the engaging portion to release the blocking component while the door closes over the chassis.

According to the claimed disclosure, the chassis further includes a first combining portion disposed on a position of the chassis opposite to the axial hole. The door includes a second combining portion adapted to detachably combine with the first combining portion while the door closes over the chassis.

The detachable rotating mechanism and the related electronic device of the present disclosure have easy assembly/disassembly function, and the latching component can be manually rotated to rapidly assemble and disassemble the detachable rotating mechanism, so as to detach the door from the chassis or to combine the door with the chassis. Further, the door can axially rotate relative to the chassis by the detachable rotating mechanism, and can sequentially stop at the positions with predetermined angle in the multistage manner.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
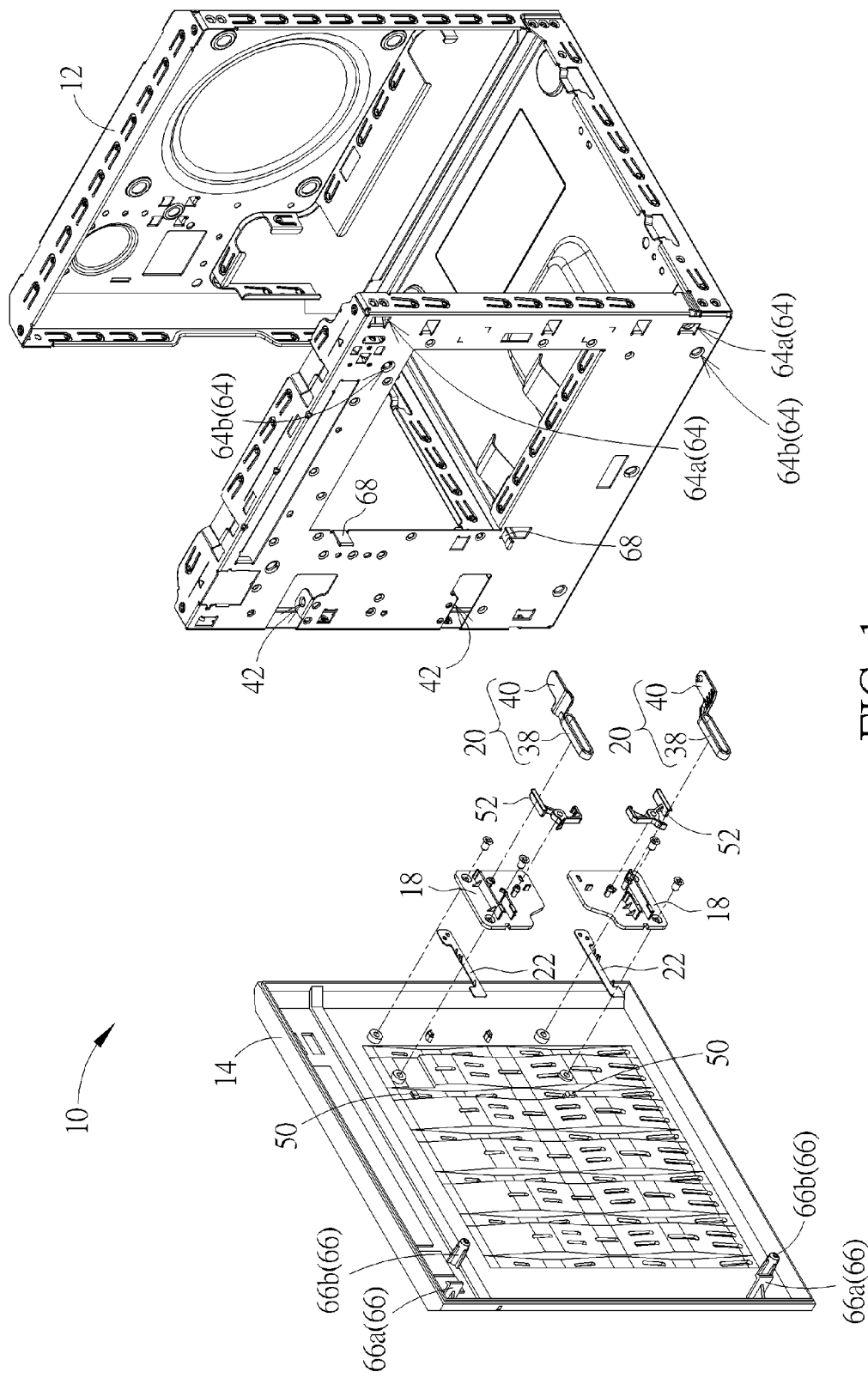
FIG. 1 is an exploded diagram of an electronic device according to an embodiment of the present disclosure.
Figure 2:
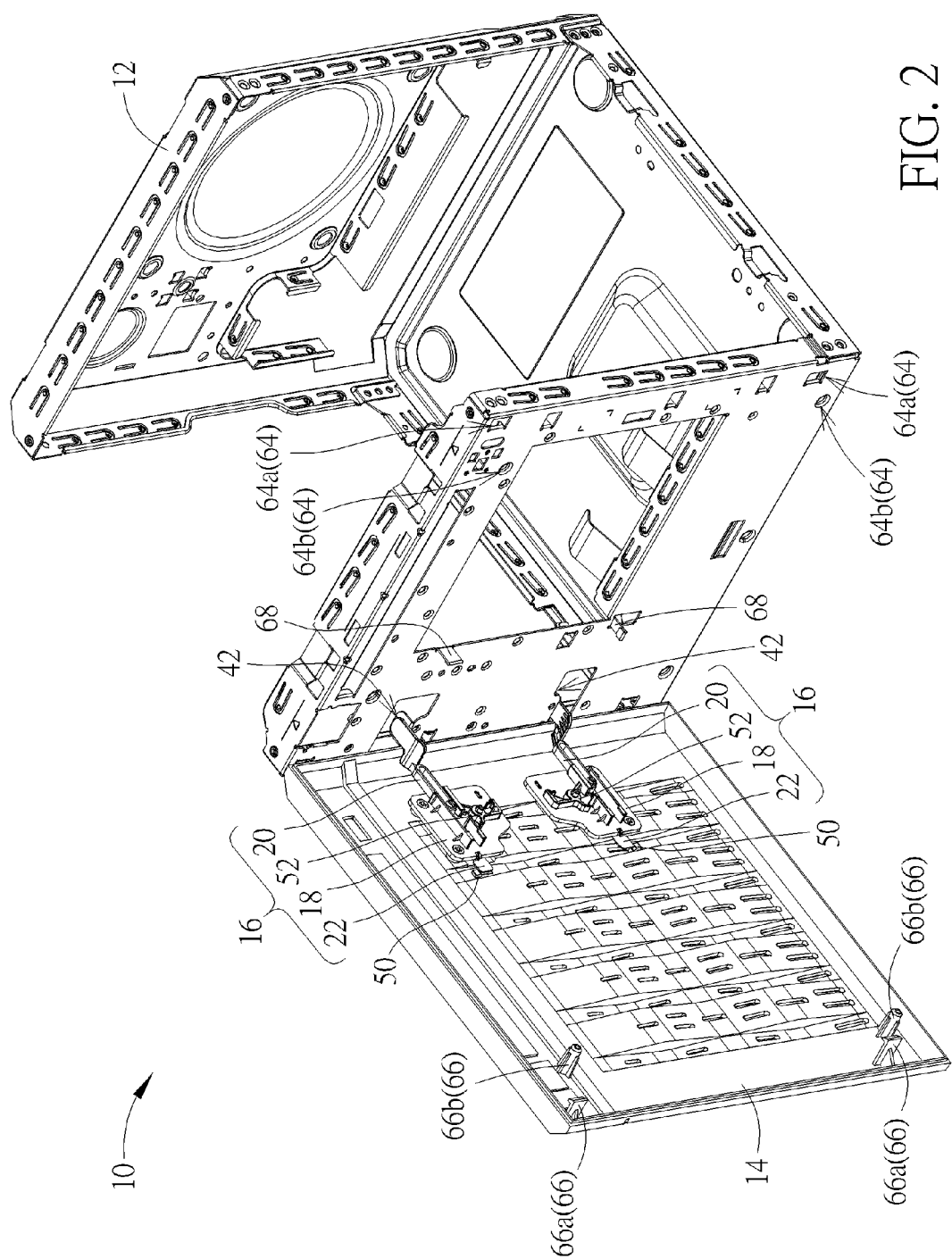
FIG. 2 is an assembly diagram of the electronic device according to the embodiment of the present disclosure.

Please refer to FIG. 1 and FIG. 2. FIG. 1 is an exploded diagram of an electronic device 10 according to an embodiment of the present disclosure. FIG. 2 is an assembly diagram of the electronic device 10 according to the embodiment of the present disclosure. The electronic device 10 includes a chassis 12, a door 14 and a detachable rotating mechanism 16. The detachable rotating mechanism 16 is disposed between the chassis 12 and the door 14, so the door 14 can rotate relative to the chassis 12 to stop at an open position, a close position and any position between the open position and the close position by the detachable rotating mechanism 16. The detachable rotating mechanism 16 further provides manual assembling/disassembling function. As the door 14 rotates relative to the chassis 12 at any position, the detachable rotating mechanism 16 can be manually disassembled from the chassis 12, and the door 14 whereon the detachable rotating mechanism 16 is disposed can be rapidly removed from the chassis 12. An amount of the detachable rotating mechanism 16 may be one or more. In the embodiment, the electronic device 10 includes two detachable rotating mechanisms 16 symmetrically disposed on different positions of the door 14 and pivotally connected to the chassis 12.

Figure 3:
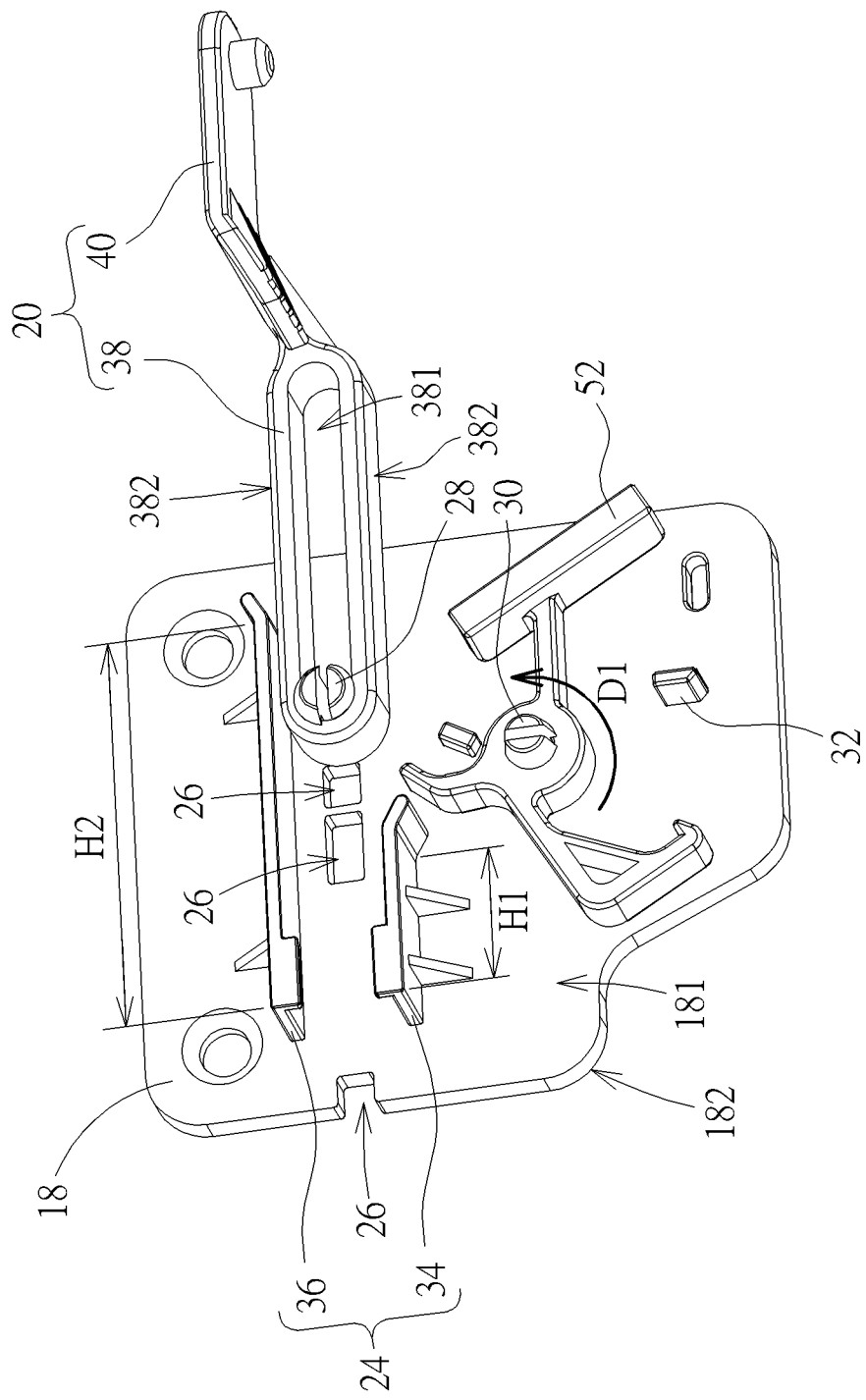
FIG. 3 is a diagram of a base, a pivoting component and a latching component according to the embodiment of the present disclosure.

Please refer to FIG. 1 to FIG. 3. FIG. 3 is a diagram of the base 18, the pivoting component 20 and the latching component 52 according to the embodiment of the present disclosure. The detachable rotating mechanism 16 includes a base 18, a pivoting component 20 and a blocking component 22. The base 18 has a first surface 181 and a second surface 182 opposite to each other. The base 18 is preferably disposed on the door 14 by the screw, the bolt or any locking method. The base 18 includes a guiding structure 24, a hole structure 26, a positioning portion 28, a boss 30 and a protrusion 32. The guiding structure 24 is disposed on the first surface 181, and is mainly composed of a first baffle 34 and a second baffle 36. It should be mentioned that a length H1 of the first baffle 34 is substantially smaller than a length H2 of the second baffle 36. An area between the first baffle 34 and the second baffle 36 is a guiding track of the guiding structure 24. A guiding space is formed between the guiding structure 24 and the first surface 181, and the pivoting component 20 can linearly move relative to the base 18 through the guiding structure 24. An amount of the hole structure 26 can be one or more. The hole structure 26 is formed between the first baffle 34 and the second baffle 36, and pierces through the first surface 181 and the second surface 182. The positioning portion 28 is disposed on the first surface 181 and adjacent to the hole structure 26, which means the positioning portion 28 is preferably disposed between the first baffle 34 and the second baffle 36. The boss 30 and the protrusion 32 are located on position adjacent to the first baffle 34.

Because the length H1 of the first baffle 34 is smaller than the length H2 of the second baffle 36, the detachable rotating mechanism 16 further pivots the latching component 52 to a position of the base 18 adjacent to the first baffle 34, and the latching component 52 can be utilized to support the pivoting component 20 while rotating to a predetermined position. The latching component 52 can rotate relative to the base 18 via the boss 30. As shown in FIG. 3, the latching component 52 can rotate at a counterclockwise direction to be arranged by the first baffle 34.

The pivoting component 20 includes a sliding portion 38 and a pivoting portion 40. The sliding portion 38 is disposed on the positioning portion 28 and slidably located between the first baffle 34 and the second baffle 36, so the pivoting component 20 can linearly move along the guiding structure 24. The pivoting portion 40 is connected to an end of the sliding portion 38. While the sliding portion 38 is slidably disposed inside the guiding structure 24, the pivoting portion 40 stretches out of the base 18 to pivotally connect with an axial hole 42 formed on the chassis 12, as shown in FIG. 2. In the embodiment, the sliding portion 38 can be a slot structure. The positioning portion 28 is disposed on a hollow region 381 of the slot structure, and the sliding portion 38 can move relative to the positioning portion 28 straightly as a direction of the slot structure. Two walls 382 of the slot structure slidably contact against the first baffle 34 and the second baffle 36 of the guiding structure 24 respectively, to ensure the pivoting component 20 moves relative to the base 18 within the predetermined guiding track.

Figure 4:
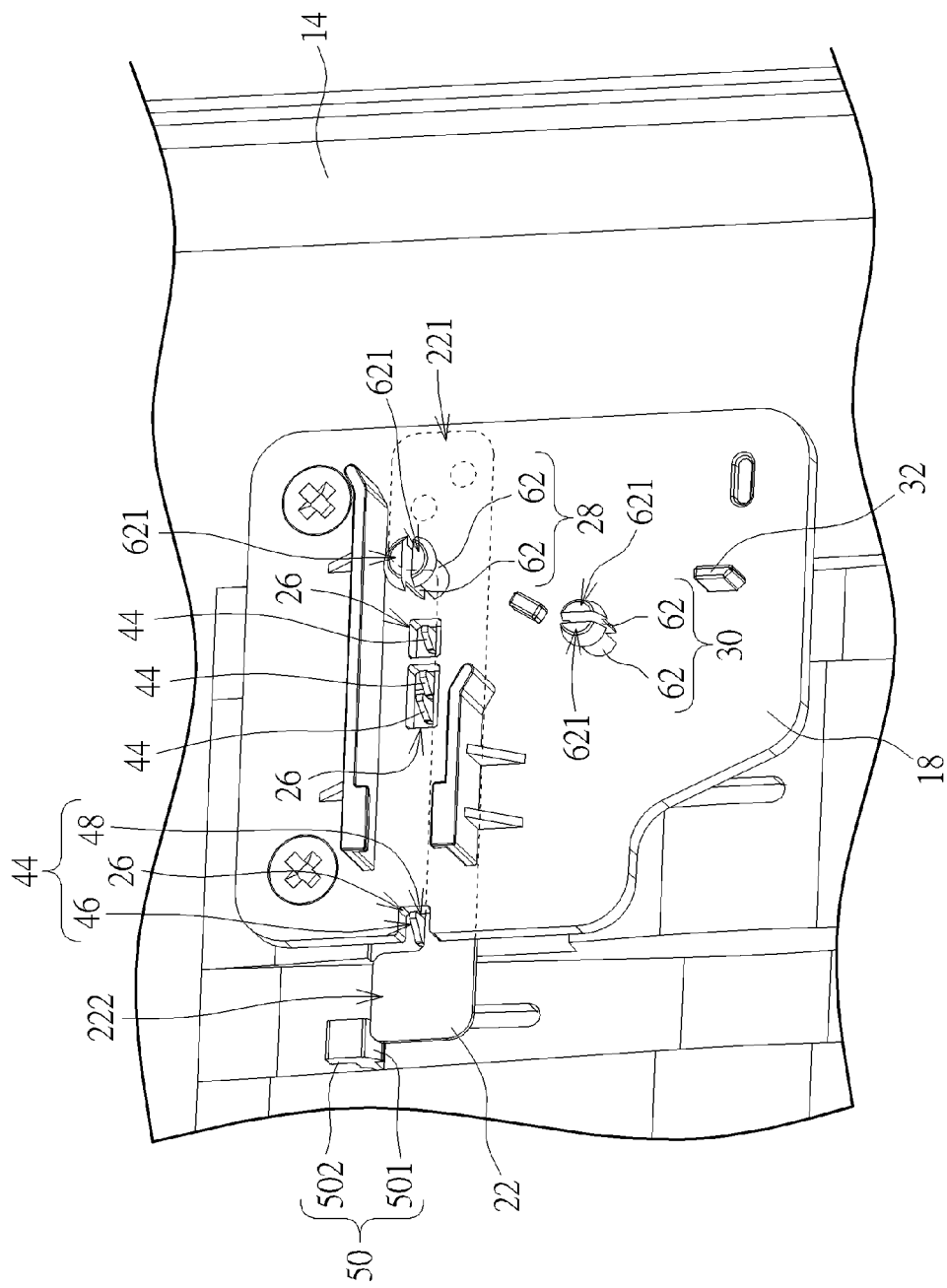
FIG. 4 is an enlarged diagram of a door and a blocking component according to the embodiment of the present disclosure.

Please refer to FIG. 1, FIG. 2 and FIG. 4. FIG. 4 is an enlarged diagram of the door 14 and the blocking component 22 according to the embodiment of the present disclosure. The blocking component 22 is a flexible slab structure which can be bent by an external force. The blocking component 22 is disposed on back (the second surface 182) of the base 18. The blocking component 22 includes one or more blocking portions 44 located between the first end 221 and the second end 222 of the blocking component 22. An amount of the blocking portion 44 is varied according to an amount of the hole structure 26, and each blocking portion 44 pierces through the corresponding hole structure 26. The blocking portion 44 includes an inclined guiding surface 46 and a blocking surface 48 formed on opposite sides of a main body of the blocking portion 44. As shown in FIG. 3, the sliding portion 38 may move close to the blocking portion 44 from the inclined guiding surface 46 (from a left side to a right side) while the pivoting component 20 moves inside the guiding structure 24; meanwhile, the sliding portion 38 presses the inclined guiding surface 46 to push the blocking portion 44 into the hole structure 26. While the sliding portion 38 moves close to the blocking portion 44 from the blocking surface 48 (from the right side to the left side), the blocking portion 44 protrudes from the first surface 181 instead of retracting into the hole structure 26, so a vertical stretching structure of the blocking surface 48 contacts against an outer wall of the sliding portion 38 to constrain a movement of the sliding portion 38 inside the guiding structure 24.

The blocking portion 44 of the blocking component 22 has to stretch out of the first surface 181 and retract into the hole structure 26 switchably. The first end 221 is fixed to the second surface 182 by a thermal melting method or a locking structure, and the second end 222 is a free end protruding from the base 18. The door 14 includes an engaging portion 50 which can be engaged with the second end 222. The engaging portion 50 may be a T-shaped structure having a first side 501 and a second side 502 opposite to each other. While the first side 501 of the engaging portion 50 is engaged with the second end 222, the blocking component 22 is deformed by pressure to be close to the door 14, and the blocking portion 44 retracts into the hole structure 26, which means the blocking portion 44 does not protrude from the first surface 181. An actuating portion 68 is a bending board disposed on a surface of the chassis 12. While the door 14 closes over the chassis 12, the actuating portion 68 of the chassis 12 presses the second side 502 of the engaging portion 50, the second side 502 is swayed due to lever principle to disassemble the second end 222 from the first side 501. The blocking component 22 can be resiliently recovered to move away from the door 14, and the blocking portion 44 pierces through the hole structure 26 to protrude from the first surface 181.

Figure 5:
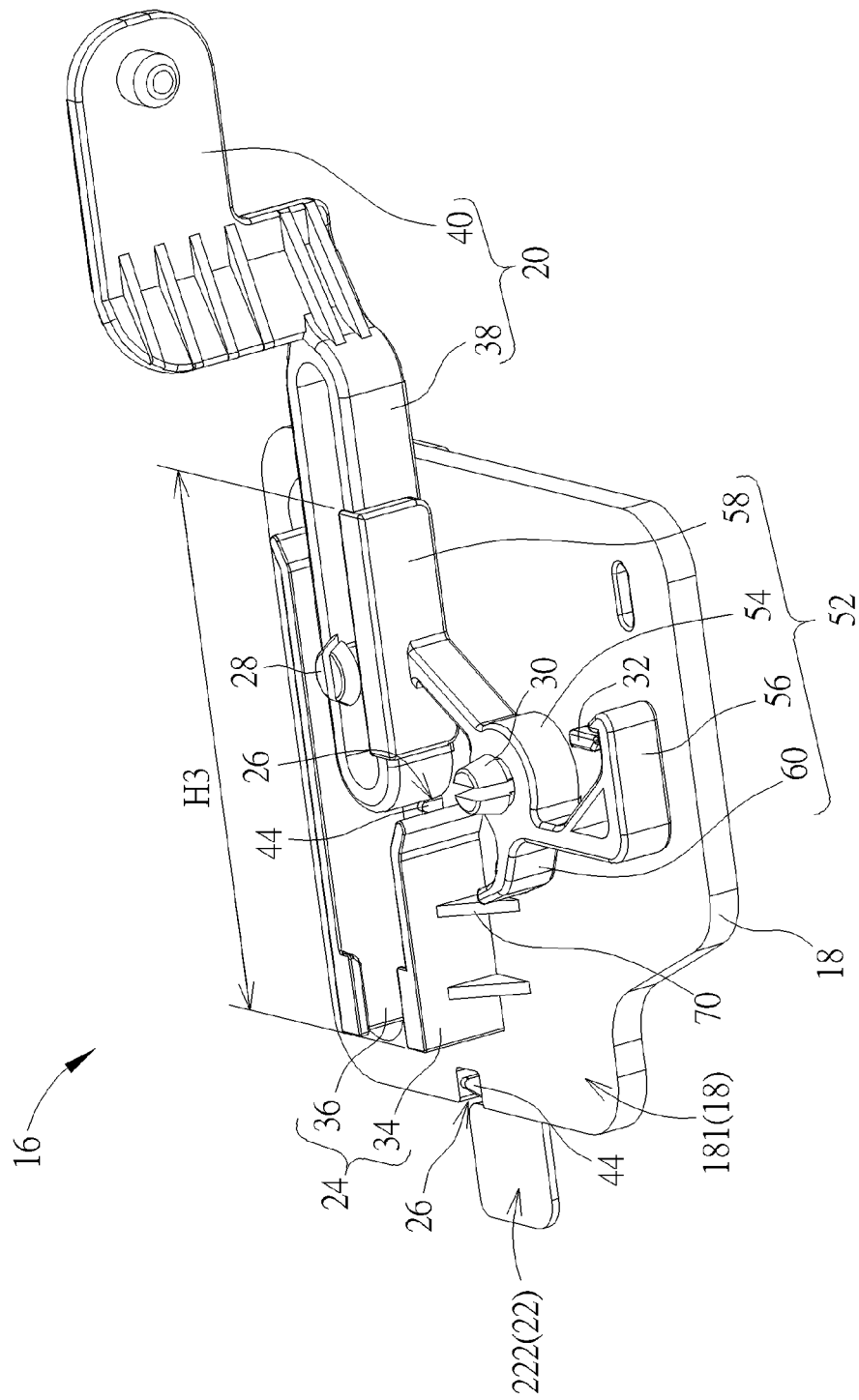
FIG. 5 is an assembly diagram of a detachable rotating mechanism according to the embodiment of the present disclosure.

Please refer to FIG. 5. FIG. 5 is an assembly diagram of the detachable rotating mechanism 16 according to the embodiment of the present disclosure. The latching component 52 includes a bearing portion 54, a buckling portion 56, a contacting portion 58 and a handling portion 60. The bearing portion 54 is rotatably disposed on the boss 30. The buckling portion 56, the contacting portion 58 and the handling portion 60 are respectively connected to different positions of the bearing portion 54. As the above-mentioned description, the handling portion 60 can be manually pressed to rotate the latching component 52 at the counterclockwise direction D1, so as to buckle the buckling portion 56 with the protrusion 32 and to simultaneously arrange the contacting portion 58 by the first baffle 34. A total length H3 of the first baffle 34 and the contacting portion 58 adjacent by each other is substantially equal to the length H2 of the second baffle 36, and the pivoting component 20 does not escape from the predetermined guiding track of the guiding structure 24 while moving relative to the base 18. As the latching component 52 is rotated at the clockwise direction to separate the contacting portion 58 from the first baffle 34, a breach is formed in an original position (whereon the contacting portion 58 is located) of the guiding structure 24, and the pivoting component 20 can be removed from the guiding structure 24 via the foresaid breach for disassembly.

It should be mentioned that the handling portion 60 can be a stretching structure with a specific length so as to contact against a rib 70 disposed by the first baffle 34. The rib 70 is a supporter disposed on a side of the first baffle 34 adjacent to the latching component 52, to enhance structural strength of the first baffle 34 which is applied to support the pivoting component 20. Position and amounts of the rib 70 are not limited to the embodiment shown in FIG. 5, and depend on design demand. For example, the first baffle 34 may have a plurality of ribs 70, and the second baffle 36 may have one or more ribs accordingly. As shown in FIG. 5, the buckling portion 56 is buckled with the protrusion 32 and the handling portion 60 can optionally contact against the rib 70 to steady the latching component 52, and the latching component 52 does not rotate relative to the boss 30. The contacting portion 58 can stably contact against the sliding portion 38 of the pivoting component 20, and the pivoting component 20 can move along the guiding track formed by the guiding structure 24 and the contacting portion 58, so as to fold and unfold the door 14 relative to the chassis 12.

As shown in FIG. 4 and FIG. 5, the blocking surface 48 of the blocking portion 44 can contact against an outer wall of the sliding portion 38 while the pivoting component 20 moves inside the guiding structure 24 and at least one blocking portion 44 of the blocking component 22 protrudes from the first surface 181. The blocking surface 48 is the vertical stretching structure that does not provide guiding function, and can be utilized to stop motion of the sliding portion 38 for positioning function. The second end 222 of the blocking component 22 is manually pressed in order to release the positioning function, the blocking component 22 is deformed to be close to the door 14, the blocking portion 44 retracts into the hole structure 26 and the sliding portion 38 can freely move within the guiding structure 24.

As shown in FIG. 3 to FIG. 5, the positioning portion 28 and the boss 30 respectively include two hooking units 62. A top of each hooking unit 62 has a hooking structure 621, and a bottom of the each hooking unit 62 is disposed on the first surface 181 in a resiliently deformable manner. A gap is existed between the two hooking units 62, which mean the hooking units 62 do not directly contact with each other. For assembly of the pivoting component 20 and the positioning portion 28 (or for assembly of the latching component 52 and the boss 30), the sliding portion 38 of the pivoting component 20 presses over the positioning portion 28 (or the bearing portion 54 of the latching component 52 presses over the boss 0), and the two hooking units 62 approach to each other by an external force. One of the hooking structures 621 may be close to or contact against the other hooking structure 621 to narrow an interval between the hooking units 62, and the sliding portion 38 can be assembled with the positioning portion 28 (or the bearing portion 54 is assembled with the boss 30) without structural interference by the hooking structure 621. While the sliding portion 38 is assembled with the positioning portion 28 (or the bearing portion 54 is assembled with the boss 30), the external force applied to the hooking unit 62 is removed, the hooking unit 62 can be bent outwardly to space the two hooking structures 621 from each other, and the hooking structures 621 can be recovered to initial positions respectively. In the meantime, the sliding portion 38 is constrained by the hooking structures 621 and cannot disassemble from the positioning portion 28 (or the bearing portion 54 cannot disassemble from the boss 30).

Please refer to FIG. 1 and FIG. 2. The chassis 12 further includes a first combining portion 64 disposed on a position of the chassis 12 opposite to the axial hole 42, which represents the first combining portion 64 and the axial hole 42 are respectively located on opposite sides of the chassis 12. The door 14 includes a second combining portion 66 disposed on a position of the door 14 related to the detachable rotating mechanism 16, which represents the second combining portion 66 and the detachable rotating mechanism 16 are respectively located on opposite sides of the door 14. While the door 14 closes over the chassis 12, the second combining portion 66 is detachably combined with the first combining portion 64 to increase foldable stability between the door 14 and the chassis 12. Generally, first combining portion 64 and the second combining portion 66 respectively can be a hook 66a and a corresponding slot 64a, or a guiding pillar 66b and a corresponding guiding hole 64b. Amounts, dispositions and positions of the first combining portion 64 and the second combining portion 66 of the present invention are not limited to the above-mentioned embodiment, and depend on design demand.

Figure 6:
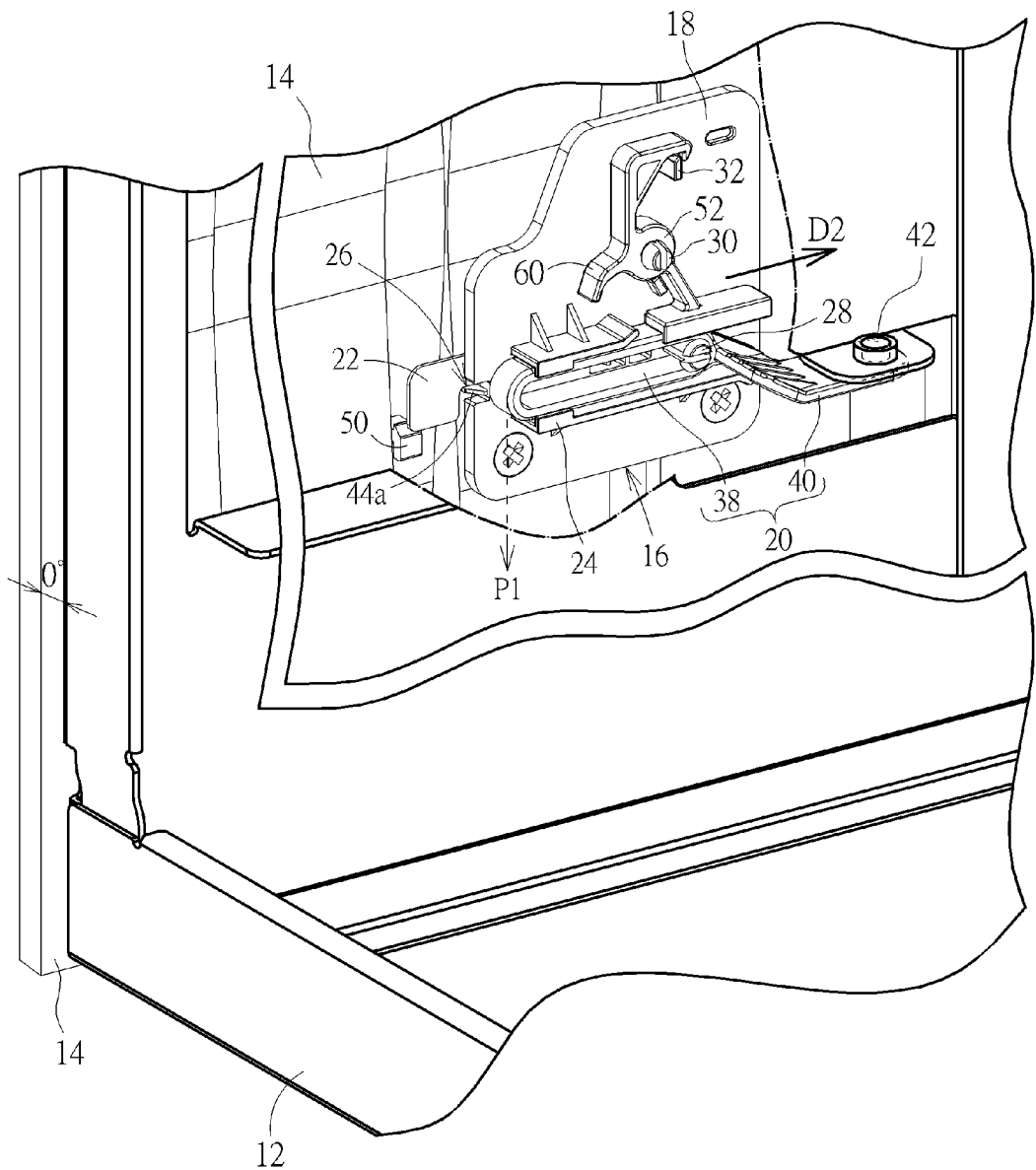
FIG. 6 to FIG. 9 respectively are diagrams of the detachable rotating mechanism in different operation modes according to the embodiment of the present disclosure.
Figure 7:
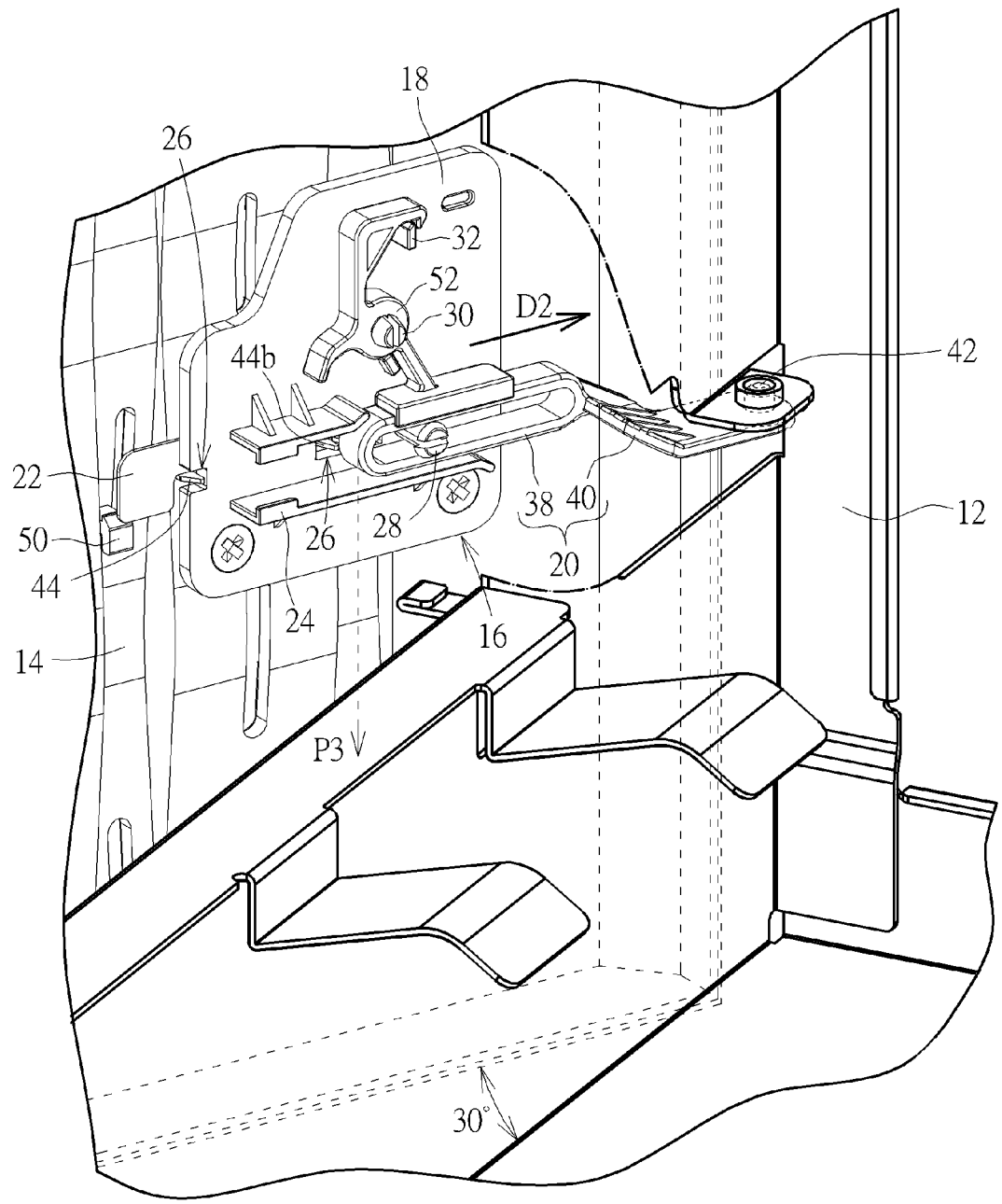

Please refer to FIG. 6 to FIG. 9. FIG. 6 to FIG. 9 respectively are diagrams of the detachable rotating mechanism 16 in different operation modes according to the embodiment of the present disclosure. As shown in FIG. 6, a right end (an end adjacent to the pivoting portion 40) of the sliding portion 38 (the slot structure) contacts against the positioning portion 28, and the left blocking portion 44a of the blocking component 22 contacts against the sliding portion 38. The pivoting component 20 is set on the first position P1, and the angle between the door 14 and the chassis 12 substantially equals zero degree, which means the door 14 is close to or closes over the chassis 12. As shown in FIG. 7, the door 14 is unfolded relative to the chassis 12, and the pivoting component 20 moves to the right (the operational direction D2) within the guiding structure 24. The left end of the sliding portion 38 presses the blocking portion 44b into the hole structure 26 and moves to a position between the blocking portion 44b and the blocking portion 44c (which is sheltered in FIG. 7 and can be shown in FIG. 8). The pivoting component 20 is set on the third position P3, and the angle between the door 14 and the chassis 12 substantially equals thirty degrees.

Figure 8:
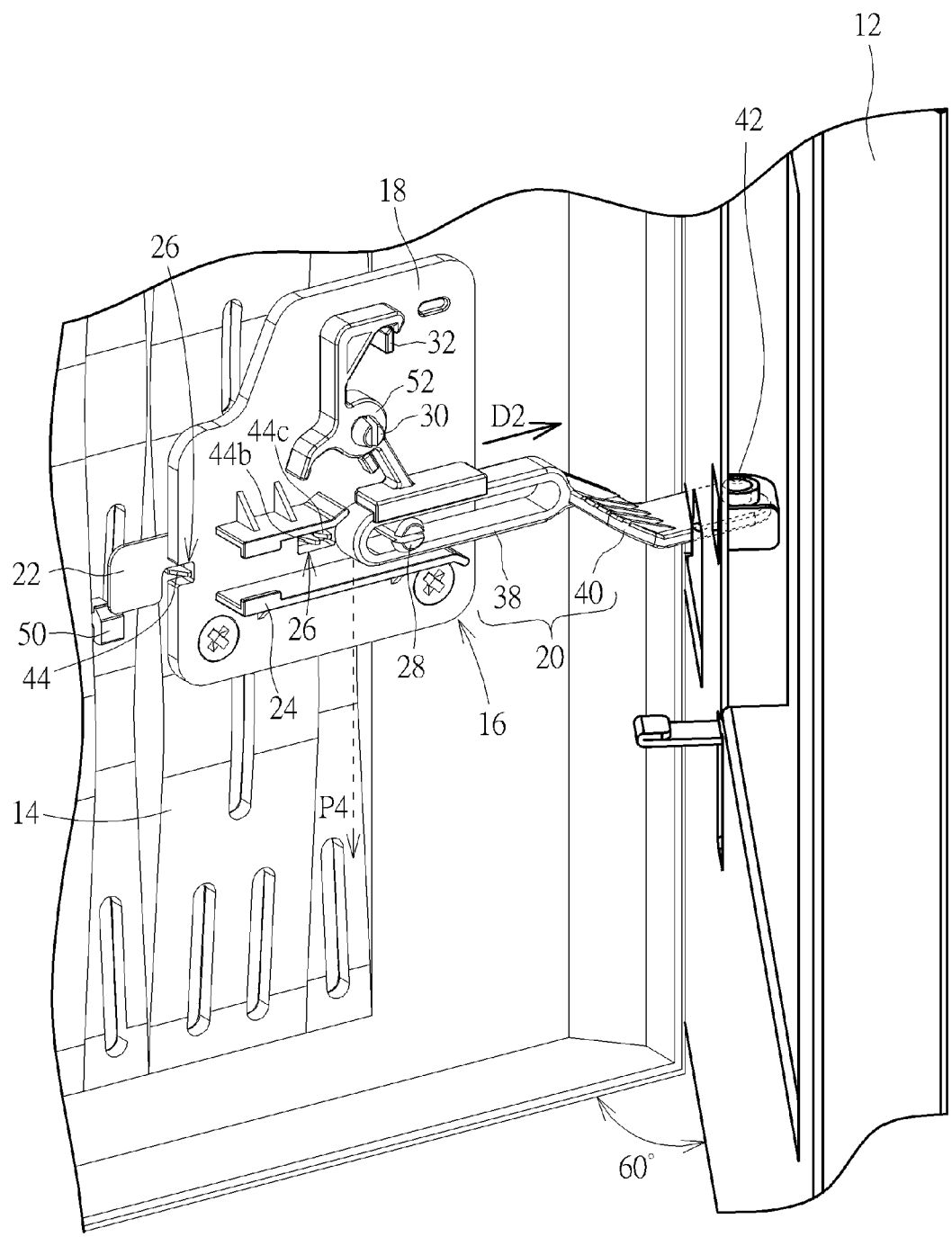
Figure 9:
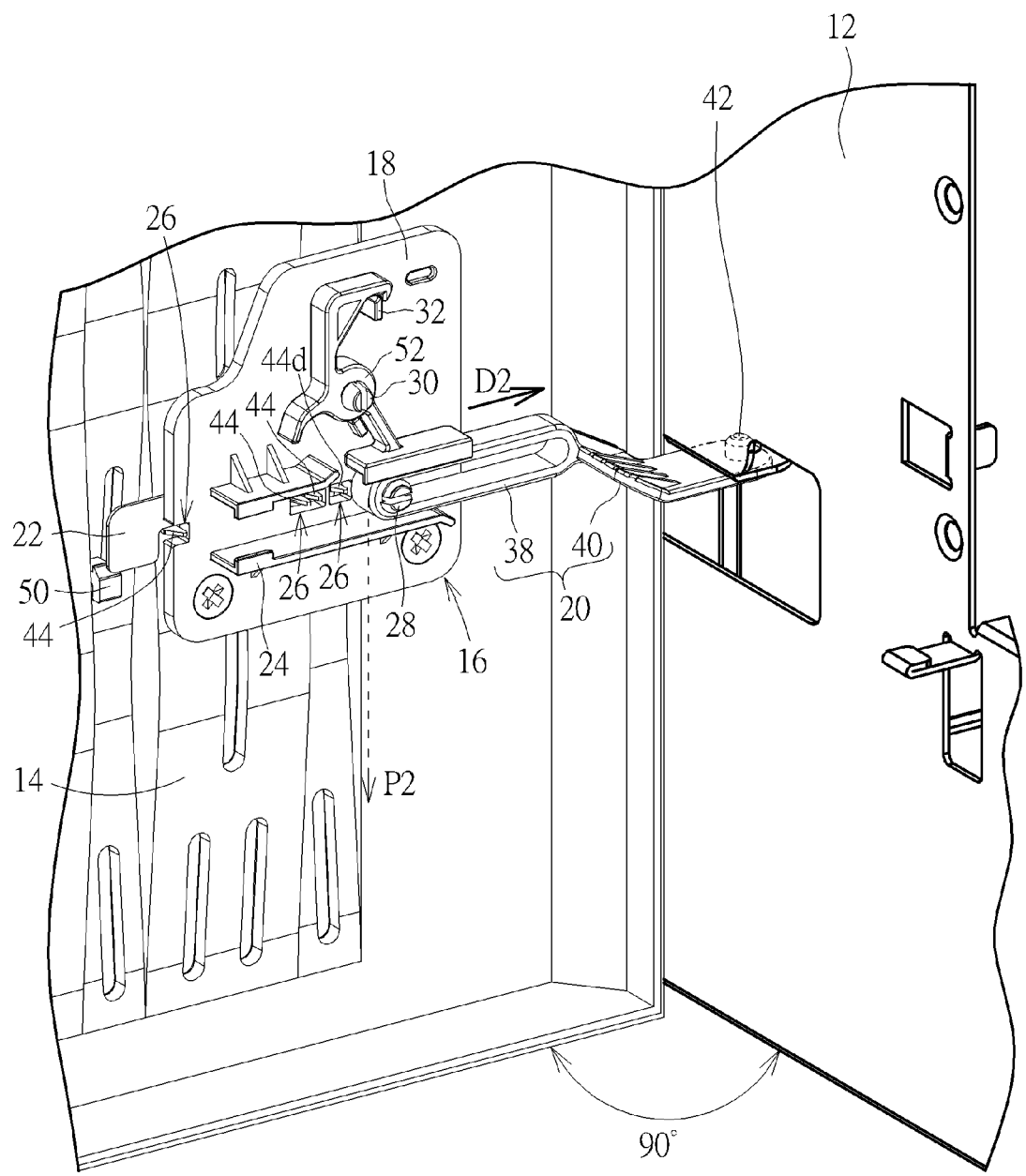

As shown in FIG. 8, the door 14 is unfolded outwardly, the pivoting component 20 moves at the operational direction D2 to be located between the blocking portion 44c and the blocking portion 44d (which is sheltered in FIG. 8 and can be shown in FIG. 9). The pivoting component 20 is set on the fourth position P4, and the angle between the door 14 and the chassis 12 substantially equals sixty degrees. As shown in FIG. 9, the left end (an end away from the pivoting portion 40) of the sliding portion 38 (the slot structure) contacts against the positioning portion 28, the blocking portion 44d contacts against the outer wall of the sliding portion 38, the pivoting component 20 is set on the second position P2 and cannot move to the left (a direction opposite to the operational direction D2) within the guiding structure 24; meanwhile, the angle between the door 14 and the chassis 12 substantially equals ninety degrees.

In conclusion, two ends of the sliding portion (the slot structure) can alternatively contact against the positioning portion to set the pivoting component on the first position P1 (with zero-degree angle between the door and the chassis) or on the second position P2 (with ninety-degree angle between the door and the chassis). An end (the outer wall of the slot structure) of the sliding portion can be engaged with the blocking portions of the blocking component, to stably orientate the pivoting component on the third position P3, the fourth position P4 or any position that is between the first position P1 and the second position P2. Due to design of the pivoting component and the blocking component of the detachable rotating mechanism, the door can be folded and unfolded relative to the chassis to sequentially stop at the zero-degree position, the thirty-degree position, the sixty-degree position, the ninety-degree position or any other position. The door is blocked by the plurality of blocking portions and cannot inwardly rotate to close over the chassis while the door is set at the specific position. The door can be smoothly folded and unfolded relative to the chassis by manually pressing the second end of the blocking component to be engaged under the engaging portion. In the meantime, the actuating portion of the chassis presses the engaging portion to release the blocking component, and the door can be outwardly rotated in a multistage manner by the detachable rotating mechanism.

Comparing to the prior art, the detachable rotating mechanism and the related electronic device of the present disclosure have easy assembly/disassembly function, and the latching component can be manually rotated to rapidly assemble and disassemble the detachable rotating mechanism, so as to detach the door from the chassis or to combine the door with the chassis. Further, the door can axially rotate relative to the chassis by the detachable rotating mechanism, and can sequentially stop at the positions with predetermined angle in the multistage manner.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A detachable rotating mechanism with positioning function, the detachable rotating mechanism comprising:
   a base having a first surface and a second surface opposite to each other, the base comprising:
      a guiding structure disposed on the first surface, a guiding space being formed between the guiding structure and the first surface;
      at least one hole structure piercing through the first surface and the second surface; and
      a positioning portion disposed on the first surface and adjacent to the hole structure;
   a pivoting component slidably disposed inside the guiding structure, the pivoting component comprising:
      a sliding portion movably disposed on the positioning portion; and
      a pivoting portion connected to the sliding portion, the pivoting portion stretching out of the base to pivot a chassis; and
   a blocking component disposed on the second surface, the blocking component comprising at least one blocking portion piercing through the hole structure to movably protrude from the first surface so as to stop a relative movement between the sliding portion and the positioning portion.

2. The detachable rotating mechanism of claim 1, wherein the guiding structure comprises a first baffle and a second baffle, and a length of the first baffle is substantially smaller than a length of the second baffle.

3. The detachable rotating mechanism of claim 2, wherein the hole structure is formed between the first baffle and the second baffle.

4. The detachable rotating mechanism of claim 2, wherein the guiding structure further comprises a rib disposed between the first surface and the first baffle, or between the first surface and the second baffle.

5. The detachable rotating mechanism of claim 1, wherein the base further comprises a boss and a protrusion, and the detachable rotating mechanism further comprises:
a latching component pivoted to a position of the base adjacent to the first baffle, the latching component comprises:
a bearing portion rotatably disposed on the boss;
a buckling portion connected to the bearing portion and adapted to buckle the protrusion; and
a contacting portion connected to a position of the bearing portion different from the buckling portion, the contacting portion is adapted to arrange by the first baffle and to contact against the sliding portion while the buckling portion is buckled with the protrusion.

6. The detachable rotating mechanism of claim 1, wherein the sliding portion is a slot structure, the positioning portion is disposed on a hollow region of the slot structure, and a wall of the slot structure slidably contacts against the guiding structure.

7. The detachable rotating mechanism of claim 6, wherein two ends of the slot structure respectively contact against the positioning portion to stop the pivoting portion at a first position or a second position, an end of the slot structure is engaged with the blocking component to stop the pivoting component at a third position, and the third position is located between the first position and the second position.

8. The detachable rotating mechanism of claim 1, wherein the blocking portion comprises an inclined guiding surface and a blocking surface, the sliding portion presses the inclined guiding surface to push the blocking portion into the hole structure, and the blocking portion further utilizes the blocking surface to constrain the relative movement between the sliding portion and the positioning portion.

9. The detachable rotating mechanism of claim 1, wherein the blocking component is a flexible slab structure having a first end and a second end opposite to each other, the first end is fixed to the second surface, the second end is a free end protruding from the base.

10. An electronic device having a rotatable door with position function, the electronic device comprising:
a chassis whereon an axial hole is formed;
a door rotatably disposed on the chassis; and
at least one detachable rotating mechanism disposed between the chassis and the door, the detachable rotating mechanism comprising:
a base disposed on the door and having a first surface and a second surface opposite to each other, the base comprising:
a guiding structure disposed on the first surface, a guiding space being formed between the guiding structure and the first surface;
at least one hole structure piercing through the first surface and the second surface; and
a positioning portion disposed on the first surface and adjacent to the hole structure;
a pivoting component slidably disposed inside the guiding structure, the pivoting component comprising:
a sliding portion movably disposed on the positioning portion; and
a pivoting portion connected to the sliding portion, the pivoting portion stretching out of the base to pivot into the axial hole on the chassis; and
a blocking component disposed on the second surface, the blocking component comprising at least one blocking portion piercing through the hole structure to movably protrude from the first surface so as to stop a relative movement between the sliding portion and the positioning portion.

11. The electronic device of claim 10, wherein the guiding structure comprises a first baffle and a second baffle, and a length of the first baffle is substantially smaller than a length of the second baffle.

12. The electronic device of claim 11, wherein the hole structure is formed between the first baffle and the second baffle.

13. The electronic device of claim 11, wherein the guiding structure further comprises a rib disposed between the first surface and the first baffle, or between the first surface and the second baffle.

14. The electronic device of claim 11, wherein the base further comprises a boss and a protrusion, and the detachable rotating mechanism further comprises:
a latching component pivoted to a position of the base adjacent to the first baffle, the latching component comprises:
a bearing portion rotatably disposed on the boss;
a buckling portion connected to the bearing portion and adapted to buckle the protrusion; and
a contacting portion connected to a position of the bearing portion different from the buckling portion, the contacting portion is adapted to arrange by the first baffle and to contact against the sliding portion while the buckling portion is buckled with the protrusion.

15. The electronic device of claim 10, wherein the sliding portion is a slot structure, the positioning portion is disposed on a hollow region of the slot structure, and a wall of the slot structure slidably contacts against the guiding structure.

16. The electronic device of claim 15, wherein two ends of the slot structure respectively contact against the positioning portion to stop the pivoting portion at a first position or a second position, an end of the slot structure is engaged with the blocking component to stop the pivoting component at a third position, and the third position is located between the first position and the second position.

17. The electronic device of claim 10, wherein the blocking portion comprises an inclined guiding surface and a blocking surface, the sliding portion presses the inclined guiding surface to push the blocking portion into the hole structure, and the blocking portion further utilizes the blocking surface to constrain the relative movement between the sliding portion and the positioning portion.

18. The electronic device of claim 10, wherein the blocking component is a flexible slab structure having a first end and a second end opposite to each other, the first end is fixed to the second surface, the second end is a free end protruding from the base.

19. The electronic device of claim 18, wherein the door comprises an engaging portion adapted to engage with the second end of the blocking component, so as to stay the blocking portion inside the hole structure.

20. The electronic device of claim 19, wherein the chassis further comprises an actuating portion, the actuating portion presses the engaging portion to release the blocking component while the door closes over the chassis.

21. The electronic device of claim 10, wherein the chassis further comprises a first combining portion disposed on a position of the chassis opposite to the axial hole, the door comprises a second combining portion adapted to detachably combine with the first combining portion while the door closes over the chassis.

* * * * *